United States Patent [19]

Hwang

[11] Patent Number: 4,851,714
[45] Date of Patent: Jul. 25, 1989

[54] MULTIPLE OUTPUT FIELD EFFECT TRANSISTOR LOGIC

[75] Inventor: InSeok S. Hwang, Lower Macungie Township, Lehigh County, Pa.

[73] Assignee: American Telephone and Telgraph Company, AT&T Bell Laboratories, Murray Hill, N.J.

[21] Appl. No.: 131,872

[22] Filed: Dec. 11, 1987

[51] Int. Cl.$^4$ ................... H03K 19/20; H03K 19/21; H03K 19/096

[52] U.S. Cl. ................... 307/448; 307/443; 307/451; 307/585; 307/548; 307/550

[58] Field of Search ............... 307/443, 448, 451, 452, 307/453, 584, 585, 471, 542, 548, 550, 554, 568

[56] References Cited

U.S. PATENT DOCUMENTS

| | | | |
|---|---|---|---|
| 4,415,819 | 11/1983 | Mathes | 307/453 |
| 4,435,782 | 3/1984 | Kaufman et al. | 307/471 |
| 4,468,575 | 8/1984 | Mathes | 307/453 |
| 4,569,032 | 2/1986 | Lee | 307/452 |
| 4,570,084 | 2/1986 | Griffin et al. | 307/452 |
| 4,649,296 | 3/1987 | Shoji | 307/451 |
| 4,668,880 | 5/1987 | Shoji | 307/469 |
| 4,700,089 | 10/1987 | Fujii et al. | 307/585 |
| 4,710,650 | 12/1987 | Shoji | 307/452 |

FOREIGN PATENT DOCUMENTS

| | | | |
|---|---|---|---|
| 0104135 | 8/1980 | Japan | 307/448 |
| 0215131 | 12/1983 | Japan | 307/448 |

OTHER PUBLICATIONS

"Session 1: Customer and Semi-Custom Design Techniques—WAM1.3: Cascode Voltage Switch Logic: A Differential CMOS Logic Family", IEEE International Solid-State Circuits Conference, Wed. Feb. 22, 1984; Lawrence G. Heller, William R. Griffin and James W. Davis and Nandor G. Thomas; pp. 16–17.

"Zipper CMOS", IEEE Circuits and Devices Magazine, 1986, Charles M. Lee and Ellen W. Szeto, pp. 10–17.

"NORA: A Racefree Dynamic CMOS Technique for Pipelined Logic Structures", IEEE Journal of Solid-State Circuits, vol. SC-18, No. 3, Jun. 1983, Nelson F. Gonclaves and Hugo J. De Man, pp. 261–266.

"A Comparison of CMOS Circuit Techniques; Differential Cascode Voltage Switch Logic Versus Conventional Logic", IEEE Journal of Solid-State Circuits, vol. SC-22, No. 4, Aug. 1987, Kan M. Chu and David L. Pulfrey, pp. 528, 532.

"High-Speed Compact Circuits with CMOS", IEEE Journal of Solid-State Circuits, vol. SC-17, No. 3, Jun. 1982, R. H. Krambeck, Charles M. Lee, Hung-Fai Stephen Law, pp. 614–619.

"The Analysis and Design of CMOS Multidrain Logic and Stacked Multidrain Logic", IEEE Journal of Solid-State Circuits, vol. SC-22, No. 1, Feb. 1987, Chung-Yu Wu, Jinn-Shyan Wang, Ming-Kai Tsai, pp. 47–56.

Primary Examiner—Stanley D. Miller
Assistant Examiner—Tai V. Duong
Attorney, Agent, or Firm—James H. Fox

[57] ABSTRACT

In MOS logic circuits with a non-complementary circuit structure (for example, dynamic CMOS), a prior art logic gate generated only a single output signal. However, the logic tree often implements multiple functions, with one function being contained within another function. With prior art logic, if two or more of these functions are needed as separate available output signals, they have to be implemented in several separate gates. The present invention utilizes intermediate functions within the logic tree, providing gates having multiple outputs. Therefore, the present invention reduces the replication of circuitry, thus reducing circuit device count. The advantages include reduced integrated circuit chip area, speed improvement, and power savings, due to the reduction of device count and the corresponding reduction in wire lengths and output loading, etc.

1 Claim, 6 Drawing Sheets

MULTIPLE OUTPUT FIELD EFFECT TRANSISTOR LOGIC

BACKGROUND OF THE INVENTION

1. Field of the Invention

The present invention relates to integrated circuits having field effect transistor logic circuitry.

2. Description of the Prior Art

The circuit structure of an integrated logic gate may be either of the "complementary" or "non-complementary" variety. In complementary circuitry, a given logic function is implemented twice: In one approach, the pair of complementary input signals drive logic transistors of the same conductivity type. In another approach, the input signal drives two transistors of opposite conductivity types (e.g., an n-channel field effect transistor and a p-channel field effect transistor). In non-complementary circuitry a given logic input signal drives transistors of only a single conductivity type is a given logic gate. The noncomplementary circuitry may be further classified as either "static" or "dynamic". Static circuits comprise multiple-input logic gates that are capable of responding to changes in the logic inupts at any time, due to the absence of clocked pull-up or pull-down transistors. In non-complementary static circuits, static current always flows in one direction even if the gate is pulling down toward the opposite direction. Dynamic logic circuits include a clocked precharge device to precharge a string of logic transistors during a first clock phase, while a clocked evaluation transistor is turned off. During a second clock phase, the logic transistors decode the logical inputs to produce a logical output with the precharge transistor off and the evaluation transistor on. The output of a given logic gate is then fed to one or more other logic gates, thereby building up a logic circuit to implement the desired functionality.

A variety of field effect transistor logic families are known in the art; an overview of current NMOS and CMOS circuit techniques is given by R. H. Krambeck et al in "High-Speed Compact Circuits with CMOS", *IEEE Journal of Solid-State Circuits*, vol. SC-17, No. 3, pp. 614–619 (1982). As described therein, one type of dynamic logic circuit is the so-called "domino CMOS" logic. As shown in FIG. 9, a given clock signal is used to activate a multiplicity of logic gates (G1 . . . G3) simultaneously, wherein a given gate may have a multiplicity of logical inputs (e.e., I1 . . . I5). The inputs are connected to the gate electrodes of transistors in a logic "tree" comprising one or more logic "strings" of transistors connected between the precharge device (e.g., T1) and the clocked ground transistor (e.g., T11) in a given logic gate; for example, transistors T6–T8 and T9–T10 form two strings in gate G1. The logical output (e.g., O1) of a given gate is derived from the "top" of its logic tree, being the node connected to the precharge device (e.g., T1), and fed to the input of a static inverter (e.g., T12–T13). The output of a given inverter (e.g., OUT1) is connected to the input(s) of one or more other logic gates. In this manner, circuit stability is ensured. In some cases, additional precharge devices (e.g., T4 and T5) are connected to the intermediate nodes of a given logic tree to reduce charge sharing effects. Although field effect transistors are typically of the single drain variety, the use of multidrain MOS devices has been proposed; see "The Analysis and Design of CMOS Multidrain Logic and Stacked Multidrain Logic" by W. Chung-Yu et al, *IEEE Journal of Solid-State Circuits*, vol. SC-22, No. 1, pp. 47–56 (1987). In that technique, a multidrain MOS device includes two (or more) single-drain MOS transistors whose source electrodes are tied together.

In general, it is highly desirable to increase the speed of logic circuits while reducing their area and/or power requirements, especially when the improvement can be implemented using already established device technologies. this allows more complex logic functions to be implemented on a single (or fewer) integrated circuits. A direct performance and/or economic advantage is thereby obtained, in addition to indirect advantages related to reduced circuit board area, interconnect capacitances, and power supply and cooling requirements, etc.

One class of logic circuits implements "recursive logic", wherein a logic function is repeatedly (i.e., recursively) used. In the prior art, multiple logic stages are used to implement multiple logic functions having a recursive relationship. Recursive logic is used for implementing carry look-ahead adders, multipliers, dividers etc. Other applications utilize "random" logic that contains some redundancy, wherein a given input signal appears in more that one (but not all) stages.

SUMMARY OF THE INVENTION

I have invented an integrated logic circuit technique wherein a given logic gate includes at least one string of field effect transistors coupled to a multiplicity of logical inputs, and two or more outputs, implementing two or more logic functions, that are fed to other logic gates. The outputs are taken from the top of a given string, and from at least one intermediate node. The technique may advantageously be implemented in MOS technology, with other technologies being possible. The technique is especially desirable when implementing recursive logic functions; for example, addition, multiplication, or division using carry lookahead.

DETAILED DESCRIPTION

Figure 9:
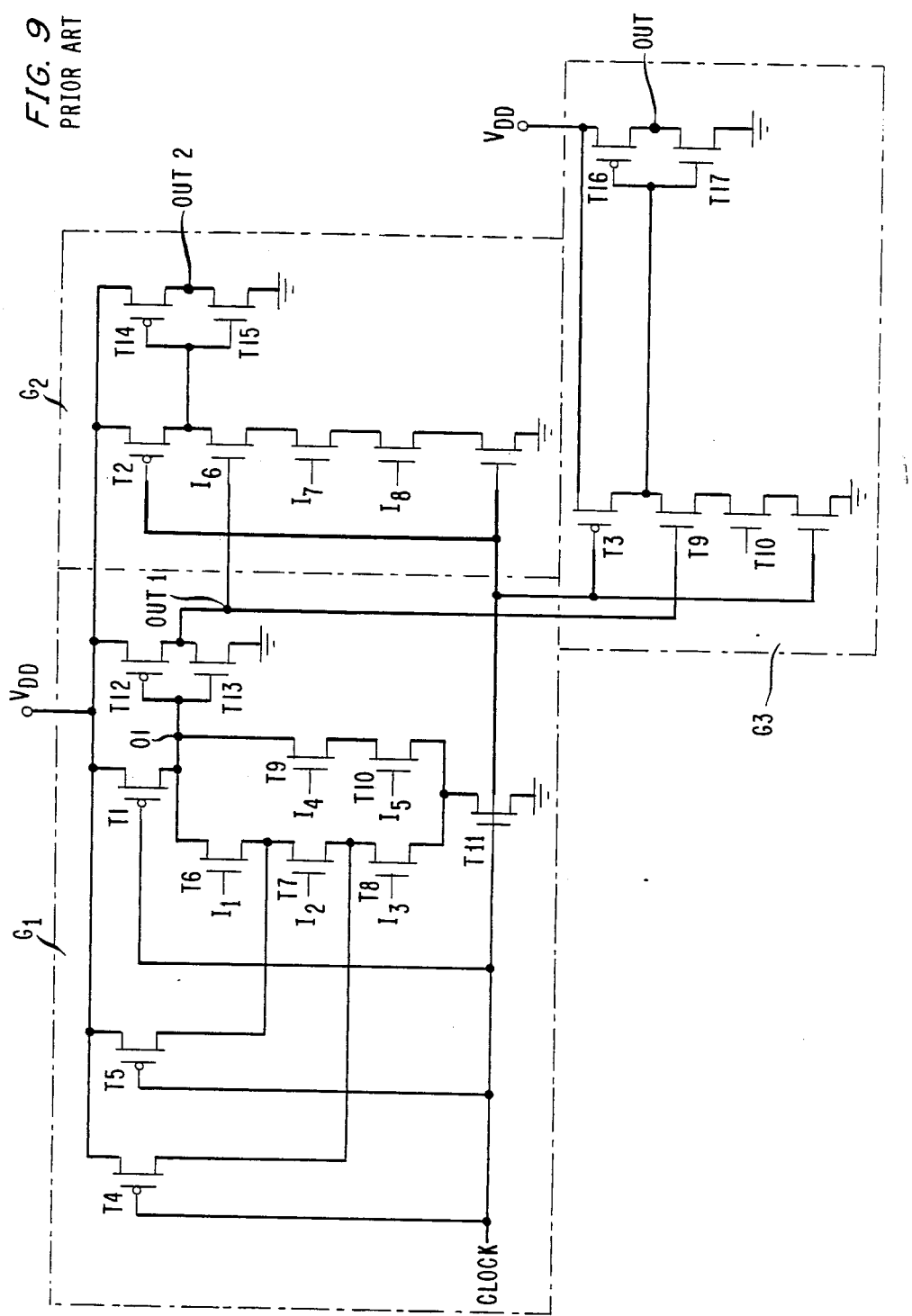
FIG. 9 illustrates a typical prior art dynamic logic gate implemented using "domino CMOS", wherein only a single output signal is obtained.

The following detailed description relates to a logic circuit technique, whereby a single logic gate produces multiple output signals using single-drain field effect transistors. An exemplary carry look-ahead adder utilizing the inventive technique is also described. In the prior art (e.g., FIG. 9), a single logic gate produced only a single output signal. Therefore, when implementing recursive logic, a separate gate was used for producing each output signal. This was true not only for the domino CMOS case (FIG. 9), but also for other logic having a noncomplementary circuit structure; for example, pseudo-NMOS, wherein a p-channel transistor acts as a static pull-up device for a logic string of n-channel transistors.

The present invention provides for using intermediate functions within a logic tree, thereby saving replication of cicuitry. This is obtained by using a logic circuit having multiple outputs, referred to in the exemplary embodiment as Multiple Output Dynamic Logic (MODL). However, the present inventive technique is not limited to dynamic circuits, but also includes noncomplementary static circuits (e.g., NMOS and pseudo NMOS), which are also included herein. As compared to conventional logic, the overall savings in device count is dependent upon the degree of recursion in the logic functions being realized. For example, in highly recursive logic, such a carry look-ahead circuits, the number of devices used is less than half that of the standard domino CMOS implementation. MODL is implemented using single drain field effect transistors (i.e., those wherein gate electrode controls a current path between a single drain and a single source.) The inventive technique can also be applied to pseudoNMOS and other dynamic derivatives.

Figure 1:
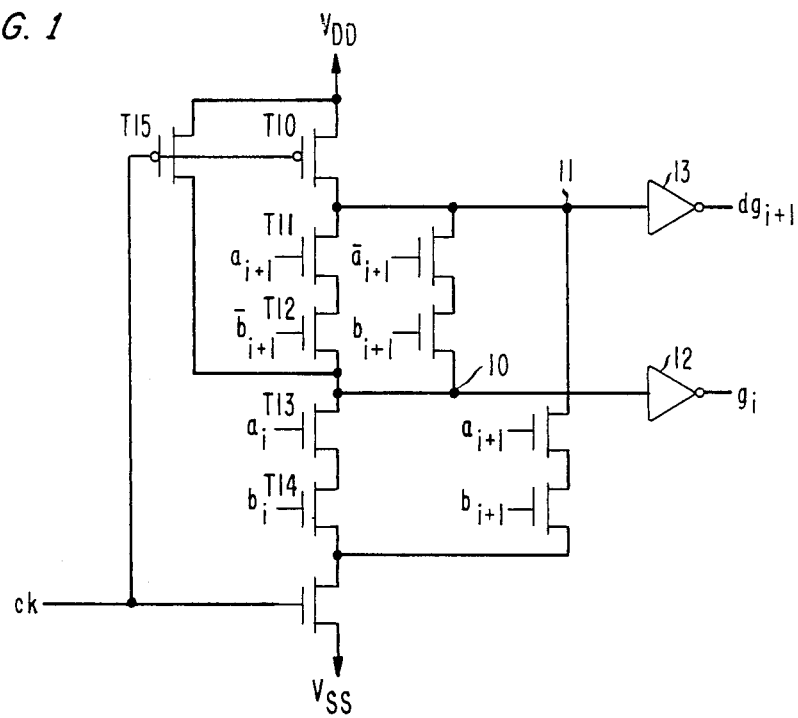
FIG. 1 illustrates a multiple output dynamic logic (MODL) gate for generating 1-bit and 2-bit generate terms.
Figure 2:
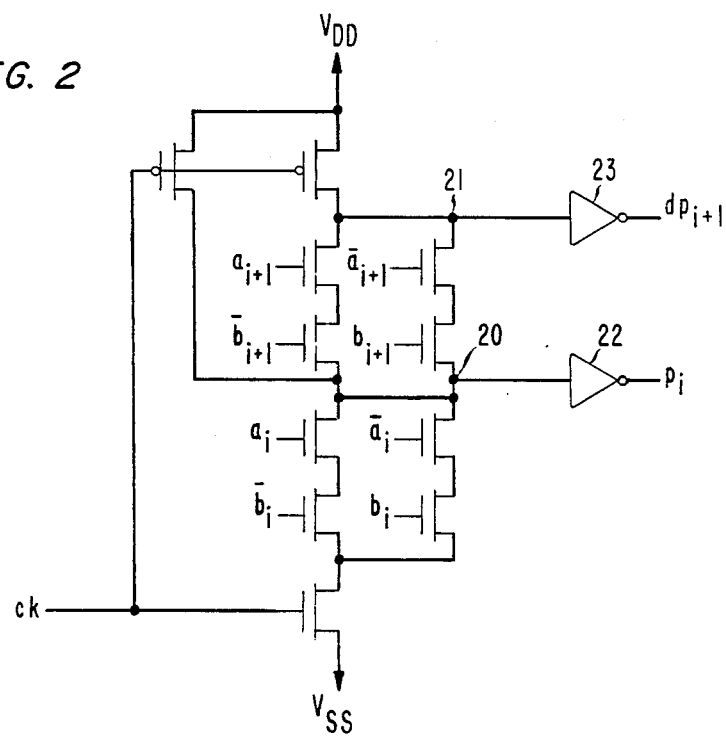
FIG. 2 illustrates a MODL gate for generating 1-bit and 2-bit propagate terms.
Figure 3:
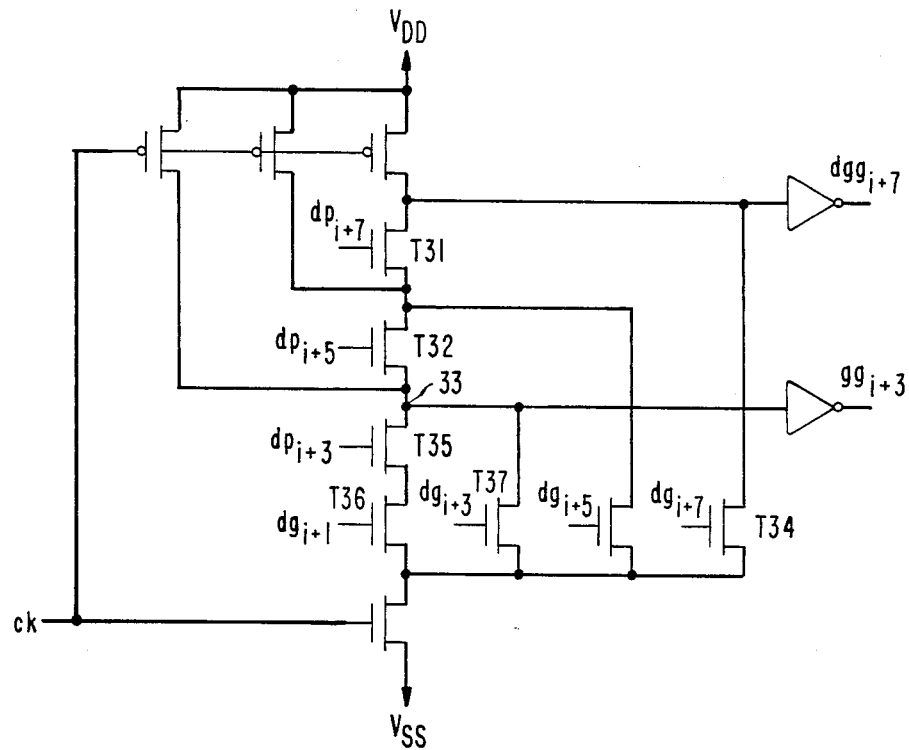
FIG. 3 illustrates a MODL gate to produce 4-bit and 8-bit group generate terms.
Figure 4:
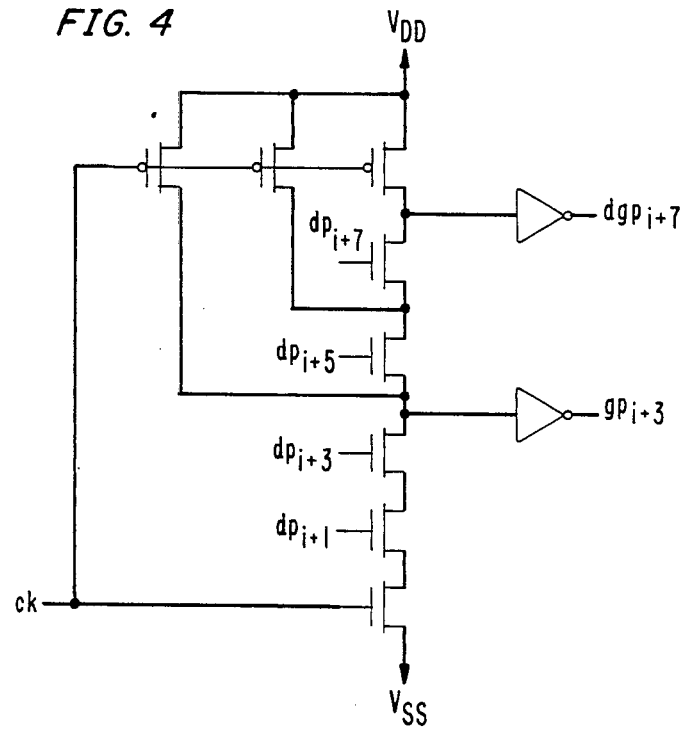
FIG. 4 illustrates a MODL gate to produce 4-bit and 8-bit group propagate terms.
Figure 5:
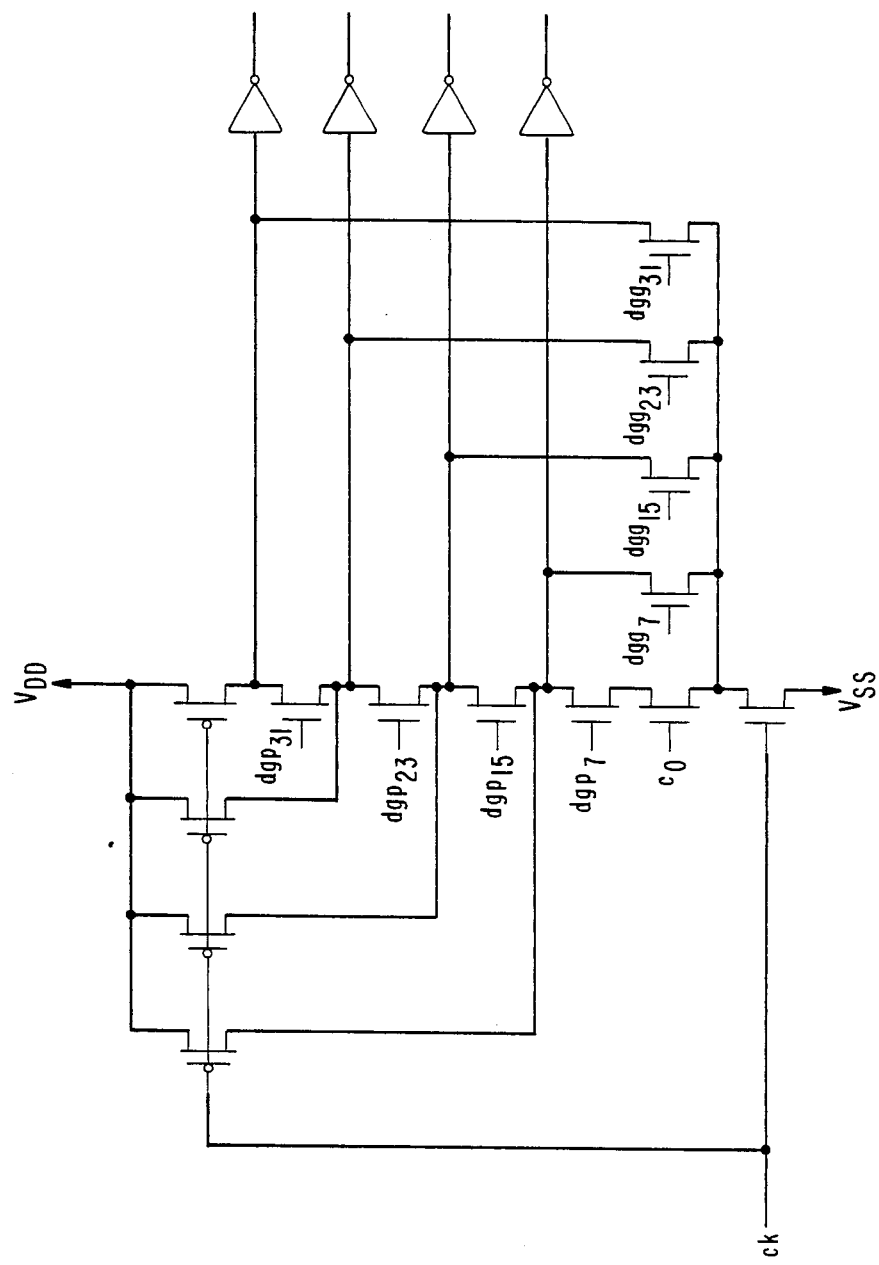
FIG. 5 illustrates a 4-bit multiple carry look-ahead MODL gate to produce group carries and carry-out.

FIGS. 1–5 show five examples of MODL gates used in an exemplary 32-bit carry look-ahead adder design. The operation of these gates basically follows that of conventional domino CMOS circuits, except that precharging and evaluation is done at multiple output nodes. For example, in FIG. 1, the output "gi" is obtained from intermediate node 10, in addition to the output "dgi+1" from node 11. This is implemented using the additional inverter 12, along with the conventional output inverter 13. Similarly, in FIG. 2 the output "pi" is obtained from intermediate node 20 through additional inverter 22, as well as the normal output "dpi+1" from node 21 through inverter 23. More than two outputs may be obtained, by utilizing more than one intermediate node, as indicated in FIG. 5. Note that the EXCLUSIVE-OR function rather than the OR function is used for the bit propagate circuits in the gates of FIGS. 1 and 2. This because otherwise, "false" discharge of dynamic output nodes lower in the logic tree of a subsequent gate is possible when dynamic nodes higher in the tree are pulled down. That is, since the gate of FIG. 3 includes OR logic, if inputs $dp_{i+7}$, $dp_{i+5}$ and $dg_{i+7}$ and were all allowed to be high, then transistors T31, T32 and T34 would be on, allowing node 33 to inadvertently discharge through these transistors, rather than discharging "downward" through the desired logic string including transistors T35 and T36 (or alternately through transistor T37). Hence, to prevent this from occurring, the inputs $dp_{i+7}$ and $dg_{i+7}$ are required to be EXCLUSIVE-OR with respect to each other. An alternative technique to avoid this problem is to apply the Boolean simplification theorem to the circuit of FIG. 3. That obtains the equivalent logic, but requires an additional transistor to prevent the reverse current flow in the inadvertent discharge path. The circuit of FIG. 4 implements a simple AND function, whereas those of FIGS. 3 and 5 implement the AND-OR function. Still more complex circuitry implementing a wide variety of logic functions may be implemented in a comparable manner.

Figure 6:
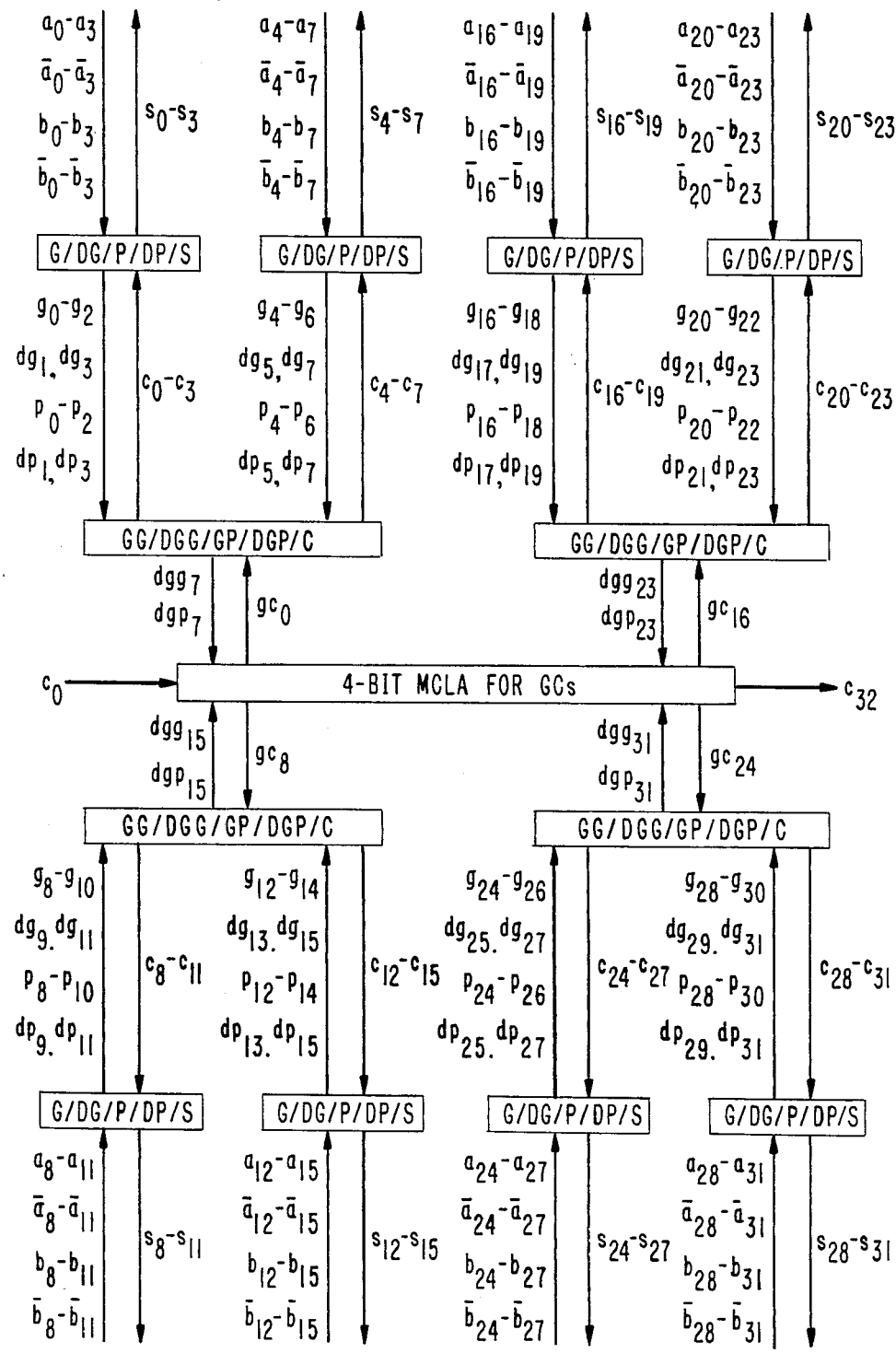
FIG. 6 illustrates the organization of a 32-bit multiple carry lookahead adder utilizing logic gates according to the inventive technique.
Figure 7:
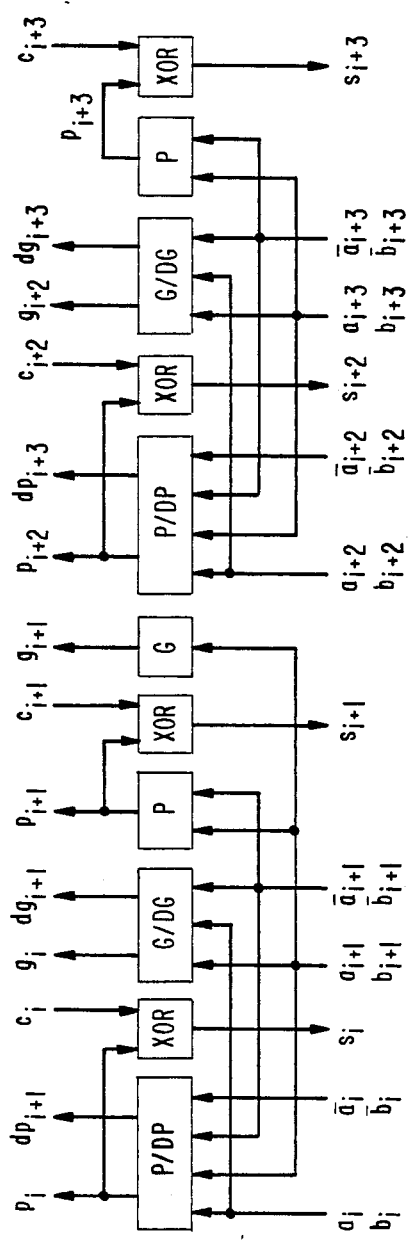
FIG. 7 illustrates details of the G/DG/P/DP/S unit of FIG. 6.
Figure 8:
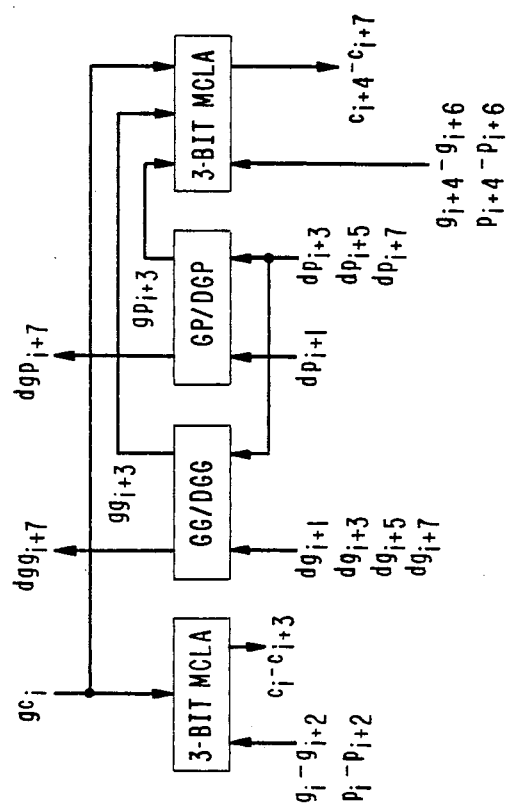
FIG. 8 illustrates details of the GG/DGG/GP/DGP/C unit of FIG. 6.

The exemplary 32-bit multiple carry look-ahead adder is organized as shown in FIG. 6, and comprises three basic units. The first unit is 4-bits wide, and creates 1-bit and 2-bit generate and propagate terms from the data inputs, as well as computes sum bits. A more detailed illustration of this circuit is shown in FIG. 7. The second unit is 8-bits wide, producing 4-bit and 8-bit group generate and propagate terms from the 2-bit generate and propagate terms, as well as calculating bit carries. This unit is shown in more detail in FIG. 8. Finally, all 8-bit group generate and propagate terms are collected in a 4-bit gate (FIG. 5), which produces the 4 group carries ($gc_0$, $gc_i$, $gc_{16}$, and $gc_{24}$). In addition to the five types of MODL gates illustrated in FIGS. 1–5, the adder uses four more types of gates: static XORs, domino CMOS gates to produce additional 1-bit generate and propagate signals, and 3-bit MODL gates. This mixture of styles demonstrates the compatibility of MODL with other CMOS logic families. A significant feature of the above organization is the efficient use of 8-bit group generate and propagate terms obtained from 2-bit generate and propagate terms, without increasing the fan-in of the group generate and propagate gates. This allows the worst-case path from the bit O data inputs to the bit 31 sum output to have 5 gate delays, while the conventional organization for a 32-bit carry lookahead adder would usually require 7 gate delays with the same fan-in limit.

The above adder design obtains a performance advantage of 1.7 times, and an area advantage of 1.5 times, as compared to a conventional domino CMOS carry look-ahead adder. While the reduced silicon area is evident, the performance is increased, and the power reduced, because of the reduction of device count, wire length, and consequently, output loading on a given stage. Perhaps even more significantly, the internal nodes to the logic tree are precharged for the functional purpose of providing output signals from the nodes. Hence, common dynamic circuit hazards, such as charge sharing, are significantly reduced without additional effort, thus making MODL a robust, manufacturable approach to high performance logic implementations. Note also that the inventive technique has been illustrated as an alternative to domino CMOS, wherein a complementary static inverter is used to isolate a given logic tree output node from the inputs of the next stage. However, the inventive technique may be used as an alternative to other logic types, for example "zipper" logic, wherein the an n-channel logic tree feeds its output to the input of a p-channel logic tree, and viceversa. In that case, the inventive technique may still be used, but without the interposition of the inverter if desired, although they are not excluded in that case either. In another implementation, the present technique is used with a static (i.e., unclocked) pull-up transistor as the load device in lieu of a clocked precharge transistor.

The pull-up transistor may be either of the same, or opposite, conductivity type as the transistors in the logic string, as in the case of static NMOS and pseudo NMOS logic, respectively. Still other implementations are possible.

What is claimed is:

1. An integrated circuit including at least one multiple output logic gate, with said logic gate comprising:

a string of single drain field-effect transistors (e.g. T31, T32, T35, T36) connected between a load transistor that is coupled to, a higher power supply voltage level (e.g. $V_{DD}$) and a lower power supply voltage level (e.g. $V_{SS}$), wherein said transistors pull a given output node located between said load transistor and the top of said string toward said lower voltage level in response to logical input signals applied to the gates of said transistors;

and at least one additional output node (e.g. 33) connected to an intermediate point of said string that is lower than said given output node.

characterized in that said logic gate further comprises at least one addition transistor (e.g. T34) connected, in parallel with one or more of the transistors in said string, whereby a false discharge path exists;

and wherein the logic input of one of said transistors in said string (e.g. T31) that is coupled between said higher voltage level and said additional output node is always mutually exclusive to the input of said additional transistor, whereby one of said transistors and said additional transistor is always turned off, thereby preventing a discharge of said additional output node through said false discharge path.

* * * * *

UNITED STATES PATENT AND TRADEMARK OFFICE
CERTIFICATE OF CORRECTION

PATENT NO. : 4,851,714
DATED : July 25, 1989
INVENTOR(S) : InSeok S. Hwang

It is certified that error appears in the above-identified patent and that said Letters Patent is hereby corrected as shown below:

Column 5, line 14, "addition" should read "additional".

Signed and Sealed this

Twenty-fifth Day of September, 1990

Attest:

HARRY F. MANBECK, JR.

*Attesting Officer*  *Commissioner of Patents and Trademarks*